United States Patent
Mido et al.

(10) Patent No.: US 6,741,448 B2
(45) Date of Patent: May 25, 2004

(54) COMPOSITE ELECTRONIC COMPONENTS

(75) Inventors: Yuji Mido, Osaka (JP); Tetsuhiro Korechika, Osaka (JP); Seiji Takagi, Osaka (JP); Tatsuo Fujii, Osaka (JP); Hideki Masumi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/258,167

(22) PCT Filed: Mar. 27, 2002

(86) PCT No.: PCT/JP02/03173

§ 371 (c)(1),
(2), (4) Date: Feb. 10, 2003

(87) PCT Pub. No.: WO02/080205

PCT Pub. Date: Oct. 10, 2002

(65) Prior Publication Data

US 2004/0022032 A1 Feb. 5, 2004

(30) Foreign Application Priority Data

Mar. 29, 2001 (JP) .................................... 2001-095737

(51) Int. Cl.⁷ .............................................. H01G 4/35
(52) U.S. Cl. ............... 361/302; 361/523; 361/525; 361/528; 361/502; 361/509; 29/25.03
(58) Field of Search .......................... 361/302, 306.1, 361/306.3, 311–313, 321.1, 523, 525, 528–529, 502–504, 508–512, 516–519, 433, 323; 29/25.03

(56) References Cited

U.S. PATENT DOCUMENTS

| | | | | |
|---|---|---|---|---|
| 6,400,554 B1 | * | 6/2002 | Shiraishi et al. | 361/508 |
| 6,678,144 B2 | * | 1/2004 | Higashi et al. | 361/306.3 |
| 2002/0075633 A1 | * | 6/2002 | Shimada et al. | 361/508 |
| 2003/0026064 A1 | * | 2/2003 | Nakada et al. | 361/523 |
| 2003/0039093 A1 | * | 2/2003 | Tadanobu et al. | 361/503 |
| 2003/0081374 A1 | * | 5/2003 | Takada | 361/523 |

FOREIGN PATENT DOCUMENTS

JP 5-326339 12/1993

* cited by examiner

Primary Examiner—Dean A. Reichard
Assistant Examiner—Nguyen T. Ha
(74) Attorney, Agent, or Firm—Wenderoth, Lind & Ponack, L.L.P.

(57) ABSTRACT

A dielectric coating, a solid electrolytic layer and a collector layer are provided to one face of a porous valve metal sheet. An insulating section covers this metal sheet including the layers discussed above. Conductive bodies, which are coupled with a first connecting terminal and a second connecting terminal, respectively, are surfaced on at least one face of the insulating section. Connecting bumps are formed on these conductive bodies, so that ICs and other parts are coupled with these bumps. This structure realizes a thin composite electronic component having an excellent high-frequency response.

20 Claims, 8 Drawing Sheets

COMPOSITE ELECTRONIC COMPONENTS

TECHNICAL FIELD

The present invention relates to a composite electronic component to be used in various electronic apparatuses.

BACKGROUND ART

A conventional composite electronic component comprises an integrated circuit (IC), a capacitor, an inductance, and a resistor placed on a circuit board. In such a conventional composite electronic component, a capacitor is mounted on a circuit board as a solid electrolytic chip-capacitor in the same manner as other parts such as resistors and inductance parts.

Electronic circuits have been digitized recently in response to the market's demand, and this tendency involves high-frequency responses of electronic parts. A wiring is usually accompanied by a resistance component and an inductance component, and those components have not been raised as a problem. However, such components now block the solid electrolytic capacitor, which is surface-mounted on a circuit board together with an IC, from responding fast to a high-frequency.

SUMMARY OF THE INVENTION

The present invention aims to overcome the foregoing drawback and provide a thin composite electronic component having an excellent in high-frequency response and being directly bump-connectable to an IC. The composite electronic component of the present invention comprises the following elements: a capacitor element; an insulating section for covering the capacitor element; a connecting terminal, provided to at least one face of the insulating section, for electrically coupling with the capacitor element; a plurality of wiring patterns, provided to the same face as the connecting terminal, for conducting with electronic components; and outer terminals, provided to lateral faces of the insulating section, for electrically coupling with the capacitor element.

The capacitor element of the composite electronic component includes the following elements: a first connecting terminal provided to a porous valve metal sheet which has dielectric coating on both its surface and the inner wall of its void holes; a second connecting terminal provided to the porous valve metal sheet via a solid electrolytic layer at the face opposite to the first connecting terminal; holes at least communicating with the first connecting terminal and the second connecting terminal, the hole having an insulating film on its inner wall; and conductive bodies formed in the holes, and the conductive bodies being electrically connected with the first and second connecting terminals but insulated from other sections.

The connecting terminals are thus formed on the surface of the thin capacitor, and various chip parts including an IC can be mounted via the connecting terminals so that high-frequency response is substantially improved. At the same time, the composite component is downsized and thinned.

BRIEF DESCRIPTIONS OF THE DRAWINGS

DETAILED DESCRIPTIONS OF EXEMPLARY EMBODIMENTS

The exemplary embodiments of the present invention are demonstrated hereinafter with reference to the accompanying drawings. The drawings illustrate essential parts of the invention in order to demonstrate points of the invention and, therefore, dimensions of the elements are scaled down differently from the actual ones.

Exemplary Embodiment 1

Figure 1:
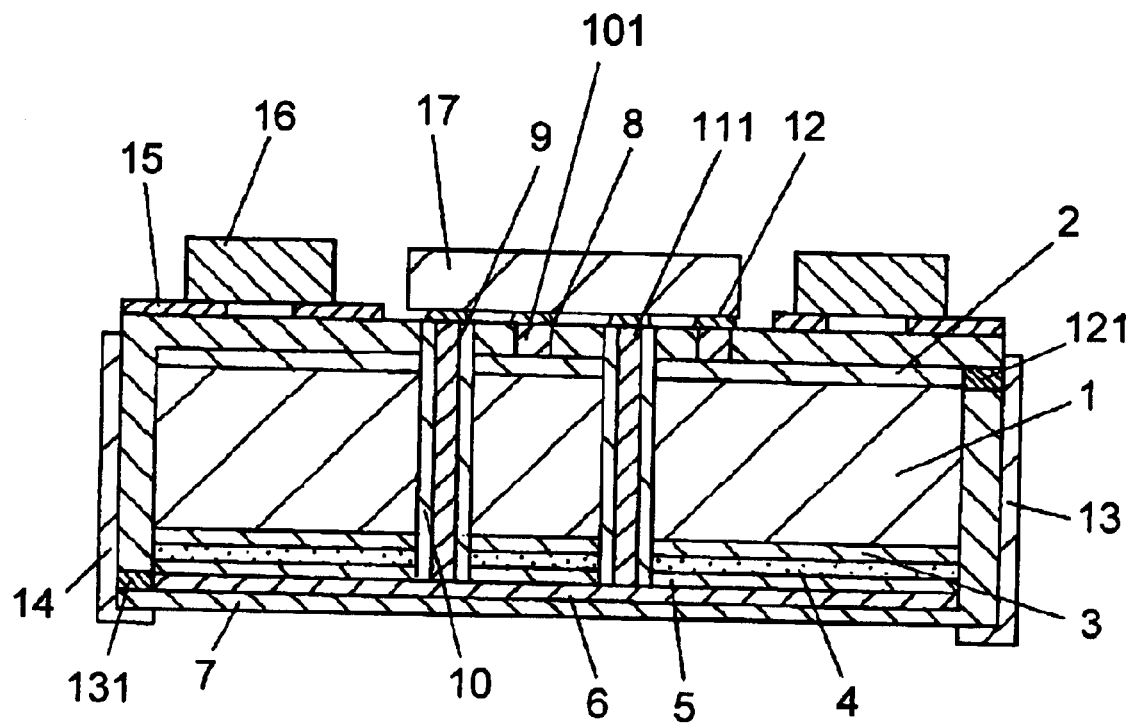
FIG. 1 shows a sectional view of a composite electronic component in accordance with an exemplary embodiment of the present invention.
Figure 2:
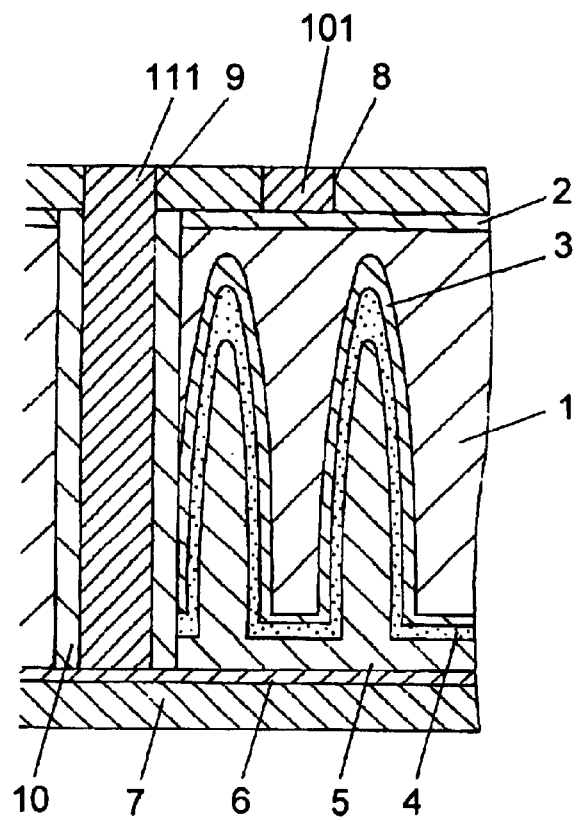
FIG. 2 shows an enlarged sectional view illustrating an essential part of the composite electronic component in accordance with an exemplary embodiment of the present invention.

FIG. 1 shows a sectional view of a composite electronic component in accordance with the first exemplary embodiment of the present invention. FIG. 2 shows an enlarged sectional view illustrating an essential part of the composite electronic component.

Electronic component 16 shown in FIG. 1 has a thickness of the order of several millimeters and, on the other hand, solid electrolytic capacitor element 200 has a thickness of the order of sub-millimeters. FIG. 1 enlarges, in particular, the capacitor element. An etched section has actually a complicated irregular shape on its surface, however, simplified pits are shown in FIG. 2 instead.

The composite electronic component shown in FIG. 1 and FIG. 2 comprises the following elements:

(a) a porous valve metal sheet 1 made from aluminum foil of which one face is etched, or made of sintered body of valve metal powder such as tantalum; and (b) a first connecting terminal 2 provided to one face of the sheet 1.

In the case of aluminum foil being used, the unetched face can be utilized as first connecting terminal 2, or a layer of another metal such as gold, copper or nickel can be formed on the unetched face of the aluminum foil. In the case of the sintered body of the valve metal powder being used, a face to which the sintered body is mounted and no dielectric coating is formed can be utilized as a first connecting terminal 2, or a layer of another metal such as gold, silver, nickel or tantalum can be formed by a spattering method or a vapor deposition method.

Anodizing the porous valve metal sheet 1 except the first connecting terminal 2 forms a dielectric coating 3 on the metal surface. A solid electrolytic layer 4 can be formed on dielectric coating 3 by chemical polymerization or electrolytic polymerization of a functional polymer layer made of e.g., polypyrrole or polythiophene. Solid electrolytic layer 4 can be also obtained by forming a manganese dioxide layer through impregnating manganese nitrate into dielectric coating 3 and pyrolytically decomposing it.

Further on solid electrolytic layer 4, a collector layer 5, made by laminating only carbon layers or carbon layers together with conductive paste layers, is formed.

In this first embodiment, a second connecting terminal 6 facing first connecting terminal 2 is formed on the collector layer 5 by spattering gold. Another metal such as copper, nickel or tantalum instead of gold can be vapor-deposited or spattered. The collector layer 5 as it is can be utilized as the second connecting terminal.

The body formed hitherto is covered overall with insulating material so that an insulating section 7 is formed. Then, a hole 8 is formed which extends through insulating section 7 on first connecting terminal 2 side and communicates with the first connecting terminal 2. Further, another hole 9 is formed which extends through the insulating section 7 on first connecting terminal 2 side, the first connecting terminal 2, the porous valve metal sheet 1, the dielectric coating 3, the solid electrolytic layer 4 and the collector layer 5, and communicates with the second connecting terminal 6. Holes 8 and 9 are formed by etching, punching or laser processing.

On the inner wall of hole 9, the insulating film 10 is formed by electro-deposition process of an insulating material. Then conductive bodies 101 and 111 made from copper plate are formed in holes 8 and 9. The conductive body 101 in hole 8 is electrically conductive with only the first connecting terminal 2, and conductive body 111 in hole 9 is electrically conductive with only second connecting terminal 6.

On the surfaces of conductive bodies 101 and 111, connecting bumps 12, made from solder, gold, tin or silver, are formed as surface connecting terminals, so that the solid electrolytic capacitor element 200 is completed. A number of, and a placement of, connecting bumps correspond to those of the ICs to be mounted thereto. A number of bumps more than the number of the ICs can be formed because chip components such as a chip inductance can be mounted between the bumps 12 which remain after the mounting of the ICs. On the insulating section 7 on the lateral faces and the bottom face of solid electrolytic capacitor element 200, an outer terminal 13 coupled with the first connecting terminal 2 as well as an outer terminal 14 coupled with the second connecting terminal 6 is formed.

Finally, electronic parts 16 such as chip-resistors, chip-ceramic capacitors, chip-inductances, ICs and the like are coupled with wiring patterns 15 so that a composite electronic component is produced. As such, ICs 17 and the like can be mounted directly to one of the faces of the thin solid electrolytic capacitor, so that a conductive pattern for wiring is not needed. As a result, high-frequency response can be remarkably improved, and since the thin solid electrolytic capacitor is equipped with electronic circuit parts 16, a thin composite electronic component is obtainable.

In the first embodiment, an aluminum foil, of which one side has been etched, is used as the porous valve metal sheet 1. Thus the aluminum foil of the aluminum electrolytic capacitor available in the market can be utilized. If a face of the aluminum foil is masked and then etched, a porous valve metal sheet 1 having desirable etching pits on only one face can be obtained with ease. This method increases the productivity of the composite electronic components. When a sintered body of a valve metal powder such as tantalum is used as the porous valve metal sheet 1, a large electrostatic capacity can be obtained.

The use of one face of the aluminum foil or sintered body of the valve metal powder as the first connecting terminal 2 eliminates the need for a metal layer which is supposed to be a separate first connecting terminal, so that the productivity can be improved as well as the cost can be reduced. However, if the reliability of the connection between conductive bodies 101, 111 formed in holes 8, 9 and the first connecting terminal 2 is desirably increased, first connecting terminal 2 is preferably formed by forming a metal layer of gold, copper or nickel on one face of the sheet 1.

A use of functional polymers such as polypyrrole or polythiophene as solid electrolytic layer 4 produces a solid electrolytic capacitor having a lower impedance, which is excellent in high-frequency response. Forming manganese dioxide is an well established method, and this method allows elaborate control even over a thickness. A use of this method thus improves the productivity and reliability. Outer terminals 13, 14 are not always necessarily, and they can be replaced with connecting bumps 12 or wiring patterns 15. The ICs and chip parts mounted to connecting bumps 12 are used as leader-electrodes.

Figure 3:
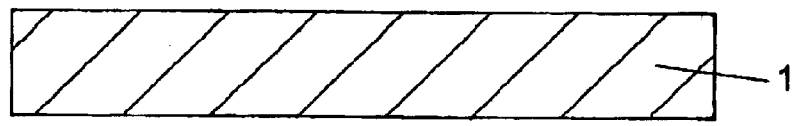
FIG. 3 shows a sectional view of a porous valve metal sheet to be used in the composite electronic component shown in FIG. 1.

A method of manufacturing the solid electrolytic capacitor of the present invention is demonstrated hereinafter with reference to the accompanying drawings. First, as shown in FIG. 3, an aluminum foil is prepared, of which one face has been etched, as a porous valve metal sheet 1. This aluminum foil is obtainable with ease by masking one face before the etching process. In FIG. 3, the etched shape to be formed on sheet 1 is omitted.

Figure 4:
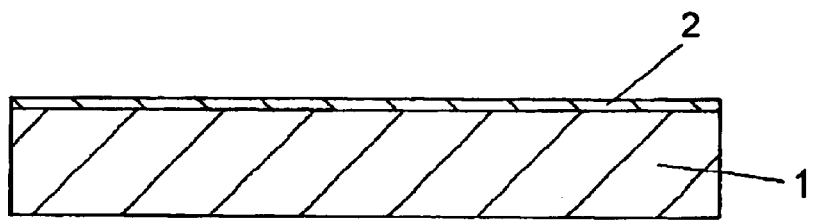
FIG. 4 shows a sectional view of the porous valve metal sheet on which a first connecting terminal is formed.

Next, as shown in FIG. 4, on the unetched face of sheet 1, a first connecting terminal 2 made from copper is formed by spattering. Terminal 2 can be also formed by vapor-deposition or sticking copper foil to the unetched face.

Figure 5:
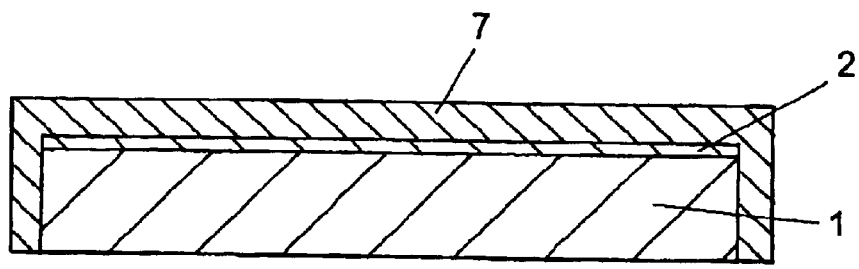
FIG. 5 shows a sectional view of the porous valve metal sheet, shown in FIG. 4, where an insulating section is additionally formed on the sheet including the first connecting terminal.

Then as shown in FIG. 5, sheet 1 is covered, except the etched face, with thermosetting polyester resin, thereby forming insulating section 7.

In this first embodiment, molding resin made of a thermosetting epoxy resin and an inorganic filler is transfermolded, thereby forming insulating section 7. Instead of the thermosetting epoxy resin, photo-curable epoxy resin, thermosetting or photo-curable unsaturated polyester resin can be used as the insulating resin. A method of application can be used instead of the transfer-molding method.

Figure 6:
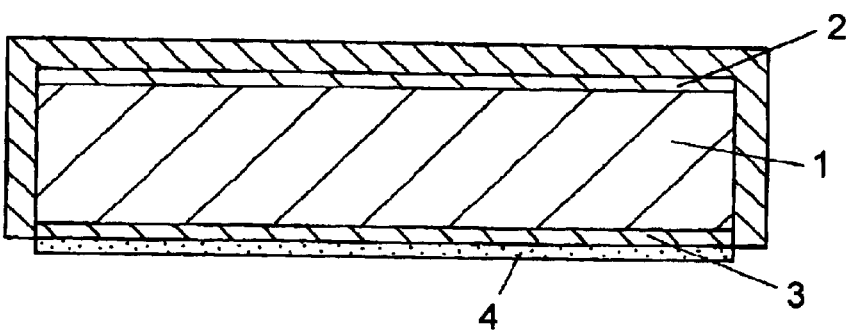
FIG. 6 shows a sectional view of the porous valve metal sheet, shown in FIG. 5, where a dielectric coating and a solid electrolytic layer are additionally formed.

Next, metal aluminum is anodized in forming solution to form a dielectric coating 3 on the surface of the metal as shown in FIG. 6. Then the metal is dipped into solution including pyrrole, and then dipped into oxidizing solution so that a thin polypyrrole film is formed on the dielectric coating 3 due to chemical oxidation polymerization. After the formation of polypyrrole thin film, the metal aluminum is dipped into solution containing pyrrole, and the polypyrrole layer is used as an anode side and an electrode in the solution is used as a cathode side for performing electrolytic polymerization. This electrolytic polymerization forms a polypyrrole layer having enough thickness on the thin polypyrrole layer. A solid electrolytic layer 4 is thus produced.

Figure 7:
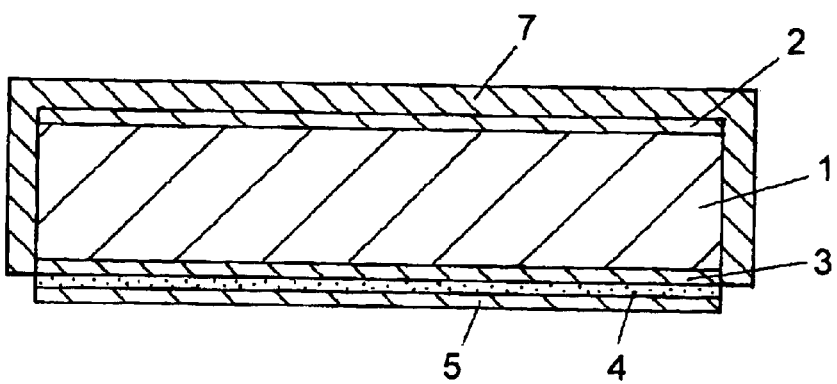
FIG. 7 shows a sectional view of the porous valve metal sheet, shown in FIG. 6, where a collector layer is additionally formed.
Figure 8:
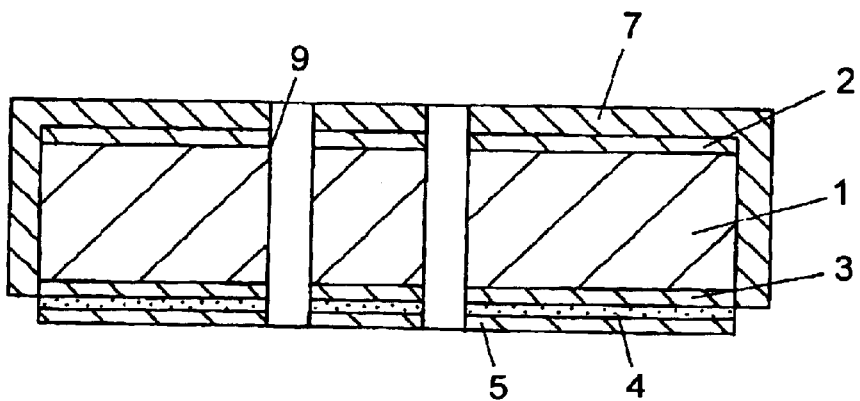
FIG. 8 shows a sectional view of the porous valve metal sheet, shown in FIG. 7, where holes are additionally formed.

Next, as shown in FIG. 7, carbon ink is applied on the solid electrolytic layer 3 and the carbon ink is dried. Next, silver paint is applied and hardened thereby forming a collector layer 5 made of a carbon layer and a silver paint layer. Then as shown in FIG. 8, through-holes 9 are punched at necessary places.

Figure 9:
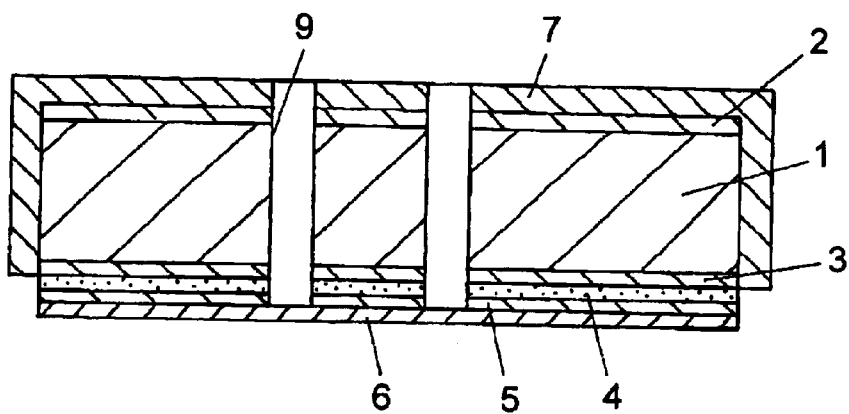
FIG. 9 shows a sectional view of the porous valve metal sheet, shown in FIG. 8, where a second connecting terminal is additionally formed.
Figure 10:
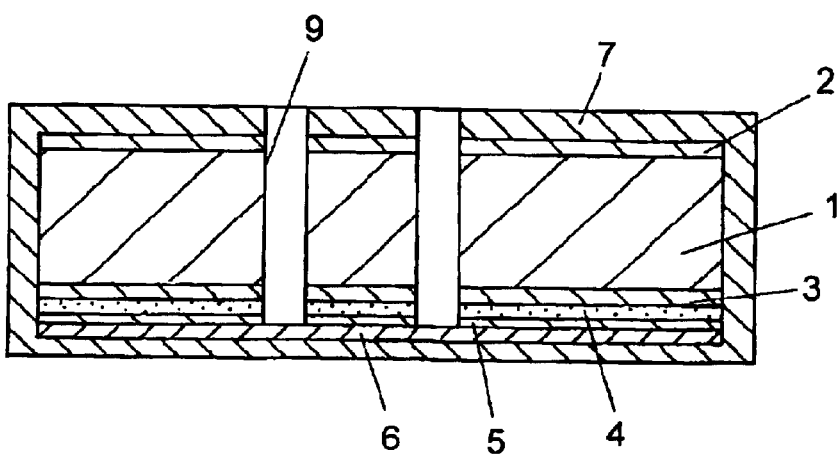
FIG. 10 shows a sectional view of the porous valve metal sheet, shown in FIG. 9, where an insulating section is additionally formed including the second connecting terminal.
Figure 11:
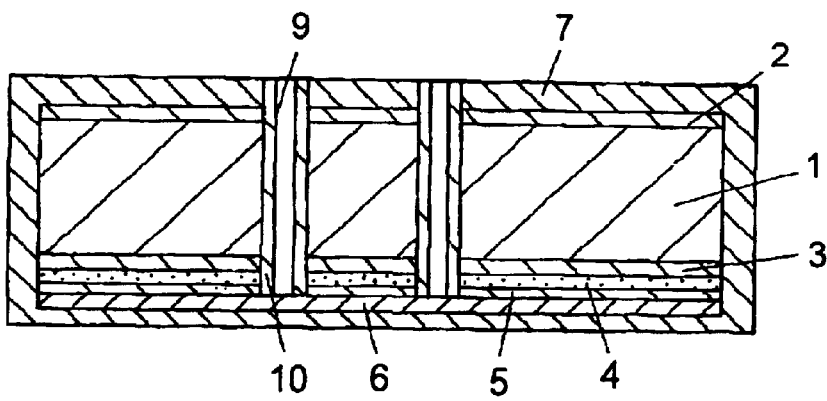
FIG. 11 shows a sectional view of the porous valve metal sheet, shown in FIG. 10, where an insulating film is formed in the holes.

Next, as shown in FIG. 9, a second connecting terminal 6 made of copper is provided to the collector layer 5 so that the terminal 6 is electrically conductive with collector layer 5. Then as shown in FIG. 10, an insulating section 7 made of thermosetting epoxy resin is extended such that it covers the second connecting terminal 6, solid electrolytic layer 4 and the surface of the collector layer 5. As a result, the entire body is covered by the insulating section 7. After that, as shown in FIG. 11, insulating film 10 made of resin is formed on the inner wall of hole 9 by an electrode-position process.

Figure 12:
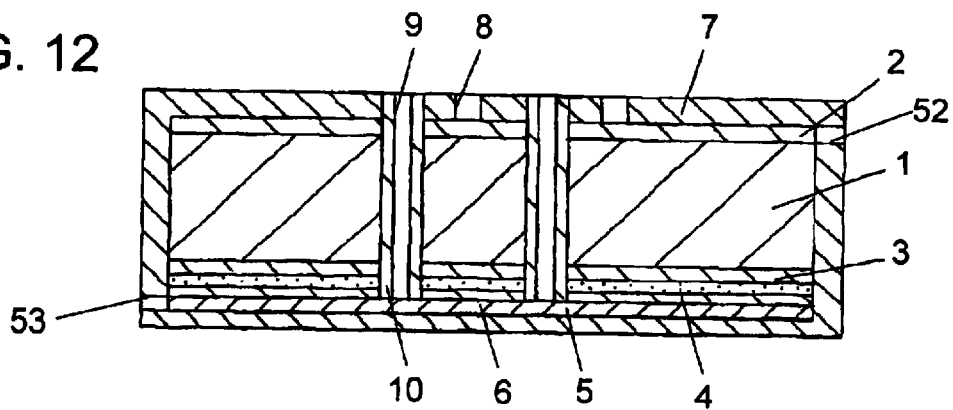
FIG. 12 shows a sectional view of the porous valve metal sheet, shown in FIG. 11, where holes are additionally provided to the insulating section on the first connecting terminal.
Figure 13:
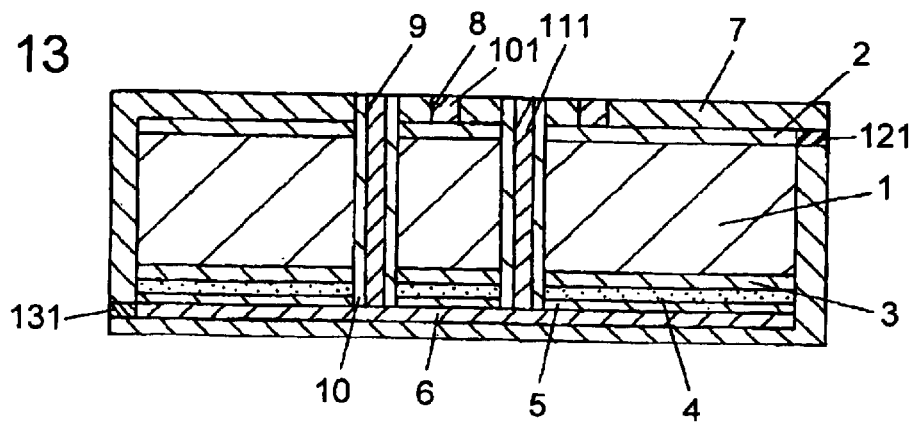
FIG. 13 shows a sectional view of the porous valve metal sheet, shown in FIG. 12, where a conductive body is formed in the respective holes.

As shown in FIG. 12, hole 8 is formed by laser process at a predetermined place on the terminal 2, and openings 52, 53 communicating with lateral faces of first terminal 2, and second terminal 6, respectively, are formed. Then, conductive bodies 101, 111, 121 and 131 made from a copper plate are formed in holes 8, 9 and openings 52, 53, respectively. The conductive body 101 in hole 8 and the conductive body 121 in opening 52 are electrically coupled with the first connecting terminal 2. The conductive body 111 in hole 9 and the conductive body 131 in hole 53 are electrically coupled with the second connecting terminal 6.

Figure 14:
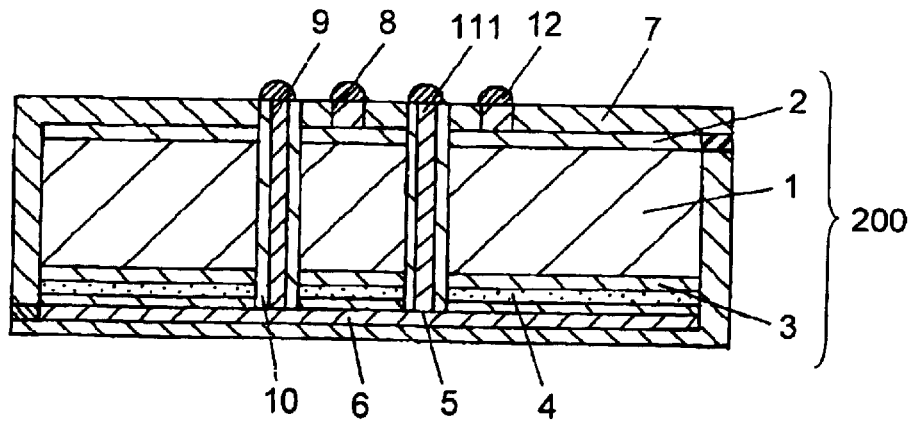
FIG. 14 shows a sectional view of the porous valve metal sheet, shown in FIG. 13, where a connecting bump is additionally provided to the respective conductive bodies.

Further, as shown in FIG. 14, surface connecting terminals 12, i.e. connecting bumps made from solder, gold or silver, are formed on the surfaces of the conductive bodies 101 and 111, thereby completing the solid electrolytic capacitor element 200.

Figure 15:
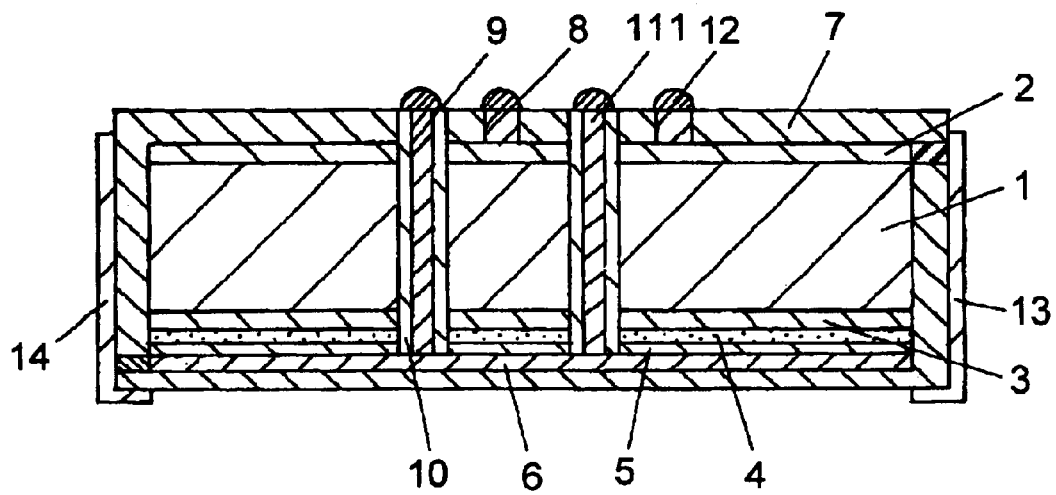
FIG. 15 shows a sectional view of the porous valve metal sheet, shown in FIG. 14, where outer terminals are additionally provided.

Then as shown in FIG. 15, outer terminals 13, 14 coupled with a first connecting terminal 2 and a second connecting terminal 6 via conductive bodies 121, 131, respectively, are formed on the lateral faces and the bottom face of the capacitor element 200.

Figure 16:
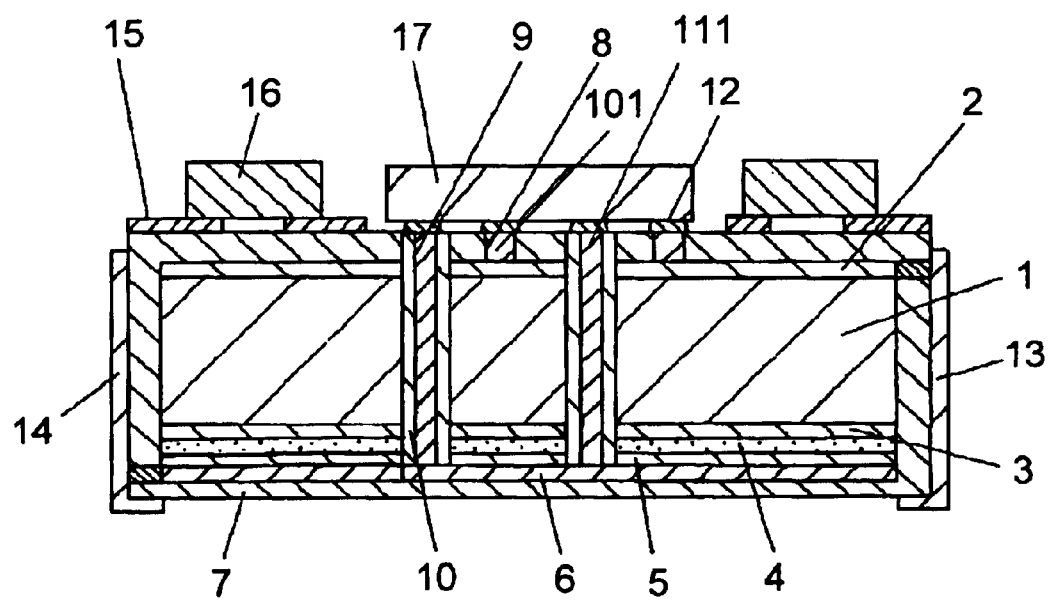
FIG. 16 shows a sectional view of the porous valve metal sheet, shown in FIG. 15, where a wiring pattern is formed and electronic parts and ICs are mounted thereon.

Next, as shown in FIG. 16, wiring pattern 15, made of conductive material and corresponding to a circuit pattern, are formed on the insulating section 7 on which connecting bumps 12 have been formed. Then, electronic components 16 including an inductance, resistors and the like, as well as an IC 17, are connected to given places, thereby producing a composite electronic component.

The present invention allows to substantially lower the inductance of an electrical path between the capacitor and the IC, thereby improving high-frequency properties.

Exemplary Embodiment 2

Figure 17:
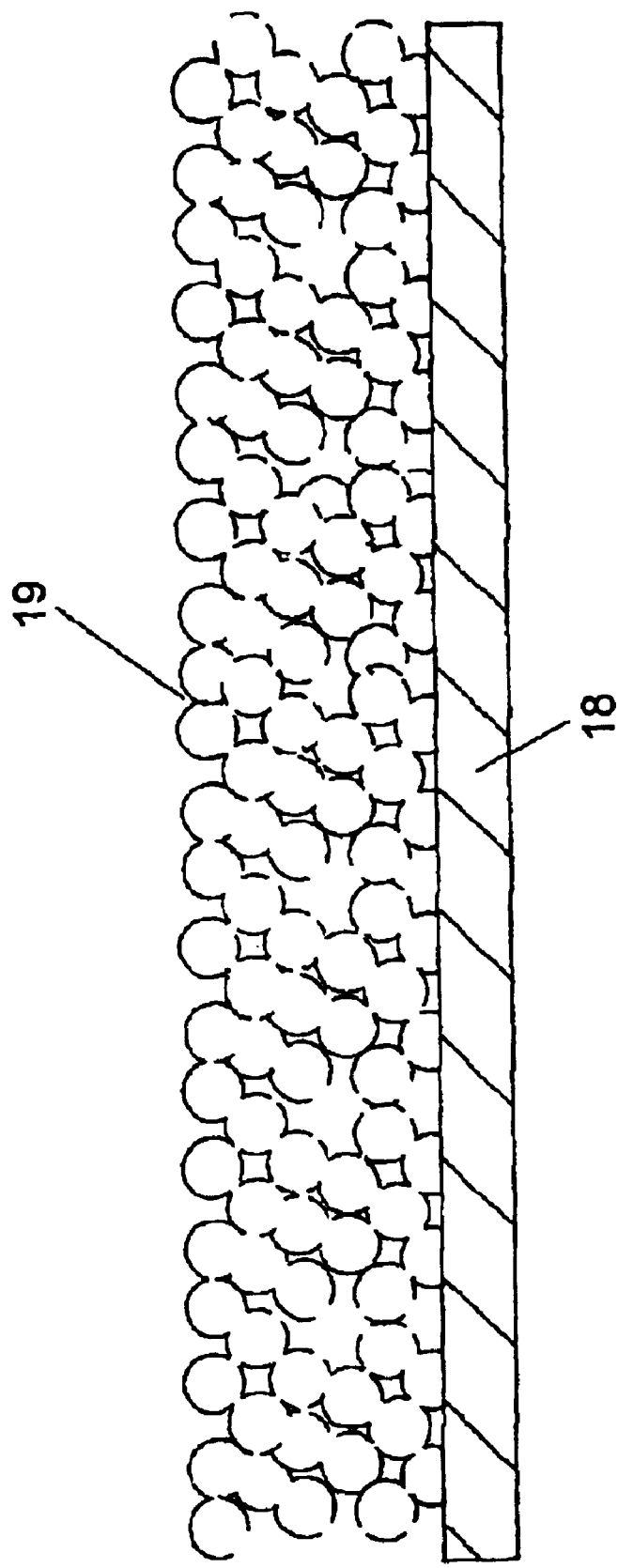
FIG. 17 shows a sectional view of a porous valve metal sheet in accordance with a second exemplary embodiment of the present invention.

In the second embodiment, a valve metal powder is used instead of an etched aluminum sheet. As shown in FIG. 17, a sintered body 19 of tantalum is coupled with one face of a tantalum foil 18, thereby forming a porous valve metal sheet 1. The steps of forming the insulating section 7 and onward, in other words, the steps shown in FIG. 5 and onward, are the same as those demonstrated in the first embodiment. A solid electrolytic capacitor is thus formed, and then a composite electronic component is produced.

In the first embodiment, as shown in FIG. 4, a first connecting terminal 2 made from copper is formed by spattering on the unetched face of a metal sheet 1 made from aluminum foil. In this second embodiment, a first connecting terminal 2 made from copper is formed by spattering on the one face, where no sintered body 19 of tantalum is formed, of the tantalum foil 18 shown in FIG. 17. The steps shown in FIG. 5 and onward are the same as those demonstrated in the first embodiment.

The completed composite electronic component has a dielectric, i.e., tantalum oxide, of which a dielectric constant is greater than that of aluminum oxide, thus the composite electronic component features not only an excellent high-frequency response but also a capacitor having a greater capacity. The sintered body of tantalum is formed of tantalum particles which can be finely divided for enlarging an effective area of the capacitor. Therefore, this structure allows an increase in both the dielectric constant and the capacity. As a result, a capacity as much as four times greater than using the etched aluminum foil is obtainable.

Exemplary Embodiment 3

Figure 18:
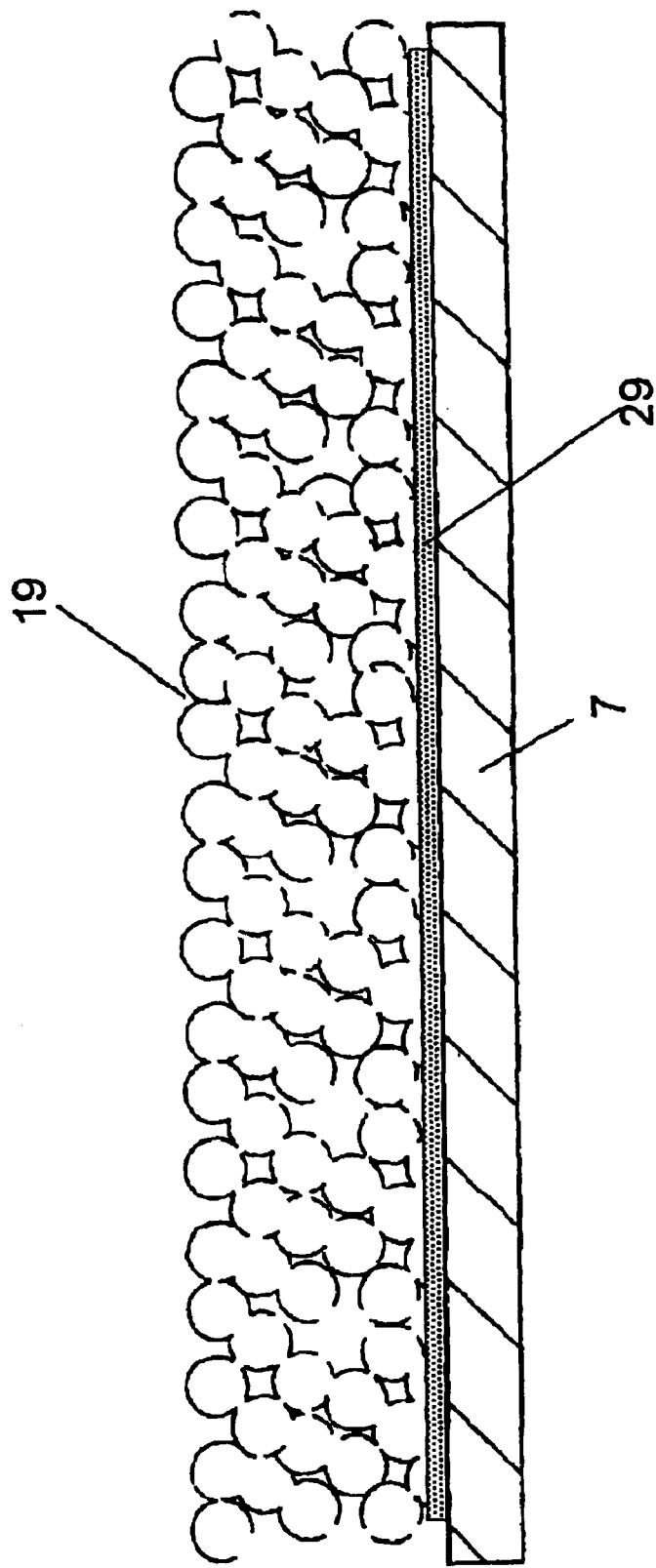
FIG. 18 shows a sectional view of a porous valve metal sheet in accordance with a third exemplary embodiment of the present invention.

Instead of using etched aluminum sheet, another valve metal powder than the second embodiment is used in this third embodiment with reference to FIG. 18. First, the metal powder of tantalum is sintered and a porous tantalum sheet 19 is formed. Second, an insulating section 7 made of thermosetting epoxy resin is formed on one face of the sheet 19. Next, the sheet 19 including insulating section 7 is anodized, thereby forming a dielectric layer over all the holes of porous sheet 19. The steps after this are the same as those in the first embodiment, i.e., the steps shown in FIG. 6 and onward. A solid electrolytic capacitor is thus formed, and finally a composite electronic component is produced. In this third embodiment, the sintered body has a metal face 29 which is covered by thermosetting resin, and the face 29 is not anodized but maintains electric conductivity.

A first connecting terminal 2 made from copper can be formed by spattering on the metal face 29, where no dielectric layer of a tantalum sintered body 19 is formed, and an insulating section 7 can be formed on terminal 2. The steps after the anodizing are the same as those demonstrated in the first embodiment.

The completed composite electronic component has a dielectric, i.e., tantalum oxide, of which a dielectric constant is greater than aluminum oxide, thus the composite electronic component features not only excellent high-frequency response but also a capacitor having a greater capacity. Further, since this structure does not employ metal sheet, a thinner composite electronic component is obtainable.

INDUSTRIAL APPLICABILITY

The present invention relates to a composite electronic component to be used in various electronic apparatuses. According to the structure of the present invention, electronic parts are placed on a thin capacitor, so that ICs can be directly connected to one face of the thin capacitor. On the face, a connecting section is formed. Further, other parts can be mounted to the face, thereby forming a thin composite electronic component useful for preparing a digital circuit as well as excellent in high-frequency response.

What is claimed is:

1. A composite electronic component comprising:
   a capacitor element including;
      a porous valve metal sheet having a first face of a porous surface and having a dielectric coating on the porous surface;
      a first connecting terminal provided on a second face of said porous valve metal sheet;
      a solid electrolytic layer provided on the dielectric coating;
      a second connecting terminal provided on said solid electrolytic layer;
   an insulating section provided on said valve metal sheet, said first connecting terminal, and said second connecting terminal;
   a first hole extending through said insulating section and communicating with said first connecting terminal;
   a second hole extending through said insulating section and said porous valve metal sheet, communicating with said second connecting terminal, and having insulating film provided therein; and
   first and second conductive bodies provided in said first hole and said second hole, respectively, said first and second conductive bodies being electrically coupled with said first and second connecting terminals, respectively, and being insulated from other sections;
   a surface connecting terminal provided on at least one face of said insulating section and being electrically coupled with said capacitor element;
   a plurality of wiring patterns provided on the same face as said surface connecting terminal; and
   first and second outer terminals electrically coupled with said capacitor element at a lateral face of said insulating section.

2. The composite electronic component of claim 1, further comprising a collector provided between said second connecting terminal and said solid electrolytic layer.

3. The composite electronic component of claim 1, wherein said porous valve metal sheet is made from aluminum foil having one face which is etched.

4. The composite electronic component of claim 1, wherein said porous valve metal sheet is made from a sintered body of a valve metal powder.

5. The composite electronic component of claim 1, wherein said porous valve metal sheet is made of a valve metal sheet on which a sintered body of the valve metal is provided.

6. The composite electronic component of claim 1, wherein said first connecting terminal is a first face of aluminum foil having a second face which is porous due to an etching process.

7. The composite electronic component of claim 1, wherein said first connecting terminal is another metal layer formed on a first face of aluminum foil having a second face which is porous due to an etching process.

8. The composite electronic component of claim 1, wherein said first connecting terminal is a face of said porous valve metal sheet made of a sintered body of a valve metal powder, wherein the face has no dielectric.

9. The composite electronic component of claim 1, wherein said first connecting terminal is another metal layer formed on a face of said porous valve metal sheet made of a sintered body of a valve metal powder, wherein the face has no dielectric.

10. The composite electronic component of claim 1, wherein said first connecting terminal is a first face of a valve metal sheet, wherein a sintered body of a valve metal powder is provided on a second face of the valve metal sheet.

11. The composite electronic component of claim 1, wherein said first connecting terminal is another metal layer formed on a first face of a valve metal sheet, wherein a sintered body of a valve metal powder is provided on a second face of the valve metal sheet.

12. The composite electronic component of claim 1, wherein said solid electrolytic layer employs a functional polymer.

13. The composite electronic component of claim 1, wherein said solid electrolytic layer employs a manganese dioxide.

14. The composite electronic component of claim 1, wherein a number of said surface connecting terminal is greater than a number of connecting bumps provided on an integrated circuit.

15. A method for manufacturing a composite electronic component, said method comprising:
   forming a capacitor element by:
      preparing a porous valve metal sheet by forming a porous surface and a dielectric coating on a first face of a valve metal sheet;
      forming a first connecting terminal on a second face of the porous valve metal sheet;
      forming a solid electrolytic layer on the dielectric coating;
      forming a second connecting terminal on the solid electrolytic layer;
      forming an insulating section on the porous valve metal sheet, the first connecting terminal, and the second connecting terminal;
      forming a first hole to extend through the insulating section and to communicate with the first connecting terminal;
      forming a second hole to extend through the insulating section and the valve metal sheet, communicate with the second connecting terminal, and have insulating film provided therein; and
      providing first and second conductive bodies in the first hole and the second hole, respectively, wherein the first and second bodies are provided so as to be electrically coupled with the first and second connecting terminals, respectively, and to be insulated from other sections;
   providing a surface connecting terminal on at least one face of the insulating section and so as to be electrically coupled with the capacitor element;
   providing a plurality of wiring patterns on the same face as the surface connecting terminal; and
   providing first and second outer terminals to be electrically coupled with the capacitor element at a lateral face of the insulating section.

16. The method of claim 15, further comprising providing a collector between the second connecting terminal and the solid electrolytic layer.

17. The method of claim 15, wherein the porous surface of the valve metal sheet is made from aluminum foil having the first face etched.

18. The method of claim 15, wherein the porous valve metal sheet is made from a sintered body of a valve metal powder.

19. The method of claim 15, wherein the porous valve metal sheet is made of a valve metal sheet on which a sintered body of the valve metal is formed.

20. The method of claim 15, wherein the first connecting terminal is a first face of aluminum foil having a second face which is porous due to an etching process.

* * * * *